US009165992B2

(12) United States Patent
Chang et al.

(10) Patent No.: US 9,165,992 B2
(45) Date of Patent: Oct. 20, 2015

(54) ARRAY SUBSTRATE AND DISPLAY PANEL USING THE SAME

(71) Applicant: Innolux Corporation, Miao-Li County (TW)

(72) Inventors: Ming-Tsung Chang, Miao-Li County (TW); Yi-Hua Hsu, Miao-Li County (TW)

(73) Assignee: INNOLUX CORPORATION, Miao-Li County (TW)

( * ) Notice: Subject to any disclaimer, the term of this patent is extended or adjusted under 35 U.S.C. 154(b) by 0 days.

(21) Appl. No.: 14/328,736

(22) Filed: Jul. 11, 2014

(65) Prior Publication Data

US 2015/0041778 A1 Feb. 12, 2015

(30) Foreign Application Priority Data

Aug. 8, 2013 (TW) ................................ 102128476 A

(51) Int. Cl.
*H01L 27/32* (2006.01)
*G06F 3/041* (2006.01)
*G06F 3/044* (2006.01)

(52) U.S. Cl.
CPC ............ *H01L 27/3262* (2013.01); *G06F 3/044* (2013.01); *G06F 3/0412* (2013.01); *H01L 27/323* (2013.01)

(58) Field of Classification Search
CPC .............. H01L 27/3262; H01L 27/323; H01L 51/5225
See application file for complete search history.

(56) References Cited

U.S. PATENT DOCUMENTS

| 5,952,037 | A | * | 9/1999 | Nagayama et al. | ............. | 427/66 |
| 2004/0257315 | A1 | * | 12/2004 | Wang et al. | ...................... | 345/82 |
| 2010/0231490 | A1 | * | 9/2010 | Okano | ............................ | 427/66 |
| 2012/0249454 | A1 | * | 10/2012 | Teraguchi et al. | ............ | 345/173 |

* cited by examiner

*Primary Examiner* — Erik Kielin
(74) *Attorney, Agent, or Firm* — McClure, Qualey & Rodack, LLP

(57) ABSTRACT

An array substrate having a first area and a second area is disclosed. The array substrate comprises a first substrate, a TFT element, an insulating layer, a first electrode layer, an organic emitting layer, a first touching electrode and a second electrode layer. The TFT element is disposed above the first substrate, and comprises a gate layer, a drain layer and a semiconductor layer. The insulating layer is disposed above the TFT element. The first electrode layer is disposed above the insulating layer. The first touch electrode is composed of one of the gate layer, the drain layer, the first electrode layer and an additional electrode layer, and transfers or receives a touch signal. The second electrode layer has a step in the boundary between the first and second areas, hence breaking off into first and second parts. The first part is electrically insulated from the second part.

9 Claims, 3 Drawing Sheets

ARRAY SUBSTRATE AND DISPLAY PANEL USING THE SAME

This application claims the benefit of Taiwan application Serial No. 102128476, filed Aug. 8, 2013, the subject matter of which is incorporated herein by reference.

BACKGROUND OF THE INVENTION

1. Field of the Invention

The invention relates in general to an array substrate and display panel using the same, and more particularly to an in-cell touch organic light emitting diode (OLED) array substrate, and display panel using the same.

2. Description of the Related Art

Touch display device can be categorized as out-cell, on-cell and in-cell type according to the position of the touch panel. An out-cell touch display device is formed by disposing a layer of touch panel over a display panel not equipped with touch function. An on-cell touch display device is formed by adding a touch sensor onto a top layer of a color filter substrate. An in-cell touch display device is formed by directly integrating a touch sensor into a display panel. Of the three types, the on-cell touch panel and the in-cell touch panel do not require the use of an external touch panel, hence reducing the thickness of the glass and thin film of the panel and complying with the trend of lightweight and thinness of electronic devices.

However, in the process of manufacturing an in-cell thin film transistor liquid crystal display (TFT-LCD) or organic light emitting diode (OLED) display, the common voltage ($V_{com}$) electrode of a TFT and the anode or cathode electrode of an OLED will shield the sensing electrode of a touch sensor. The shielding effect of common voltage electrode makes touch function deteriorate or even fail.

To obtain normal operation of an in-cell touch sensor, the display electrodes must be divided into partitions, such that the display electrodes and the sensing electrodes are staggered with each other. However, such process requires small spacing between electrodes by high-precision fine mask, not only increasing manufacturing difficulties but also incurring more cost.

SUMMARY OF THE INVENTION

The invention is directed to an array substrate and a display panel using the same. Due to the height difference of the array substrate, an electrode layer is divided into partitions and will not shield the touch sensor.

According to one embodiment of the present invention, an array substrate having a first area and a second area is disclosed. The array substrate comprises a first substrate, a thin film transistor (TFT) element, an insulating layer, a first electrode layer, an organic emitting layer, a first touching electrode and a second electrode layer. The TFT element is disposed above the first substrate, and comprises a gate layer, a drain layer and a semiconductor layer. The insulating layer is disposed above the TFT element. The first electrode layer is disposed above the insulating layer. The organic emitting layer is disposed above the first electrode layer. The first touch electrode is composed of one of the gate layer, the drain layer, the first electrode layer and an additional electrode layer, and the first electrode is for transferring or receiving a touch signal. The second electrode layer is disposed above the organic emitting layer, and has a step in the boundary between the first area and the second area. The second electrode layer comprising a first part and a second part, wherein a surface of first part is disposed above a surface of the second part. The first part is electrically insulated from the second part.

According to another embodiment of the present invention, a display panel having at least a first area and at least a second area is disclosed. The display panel comprises a first substrate, a second substrate, a TFT element, an insulating layer, a first electrode layer, an organic emitting layer, a first touch electrode and a second electrode layer. The second substrate and the first substrate are disposed oppositely. The TFT element is disposed above the first substrate, and comprises a gate layer, a drain layer and a semiconductor layer. The insulating layer is disposed above the TFT element. The first electrode layer is disposed above the insulating layer. The organic emitting layer is disposed above the first electrode layer. The first touch electrode is composed of at least one of the gate layer, the drain layer, the first electrode layer and an additional electrode layer. The first touch electrode is for transferring or receiving a touch signal. The second electrode layer is disposed above the organic emitting layer, and has a step in the boundary between the first area and the second area. The second electrode layer comprising a first part and a second part, wherein a surface of first part is disposed above a surface of the second part. The first part is electrically insulated from the second part.

The above and other aspects of the invention will become better understood with regard to the following detailed description of the preferred but non-limiting embodiment (s). The following description is made with reference to the accompanying drawings.

DETAILED DESCRIPTION OF THE INVENTION

An array substrate and a display panel using the same are disclosed in embodiments below. The array substrate can be divided into various areas. A height difference between different areas makes the display electrode broken off into different parts, such that the display electrode will not shield the touch sensor. It should be noted that detailed structures disclosed in the embodiments below are exemplary and explanatory only and are not for limiting the scope of protection of the invention. Anyone who is skilled in the technology field of the present disclosure shall be able to make necessary modifications and similar arrangements and procedures according to the needs in practical implementation. Furthermore, secondary or unimportant elements are omitted in the accompanying diagrams of the embodiments for highlighting the technical features of the invention.

Figure 1:
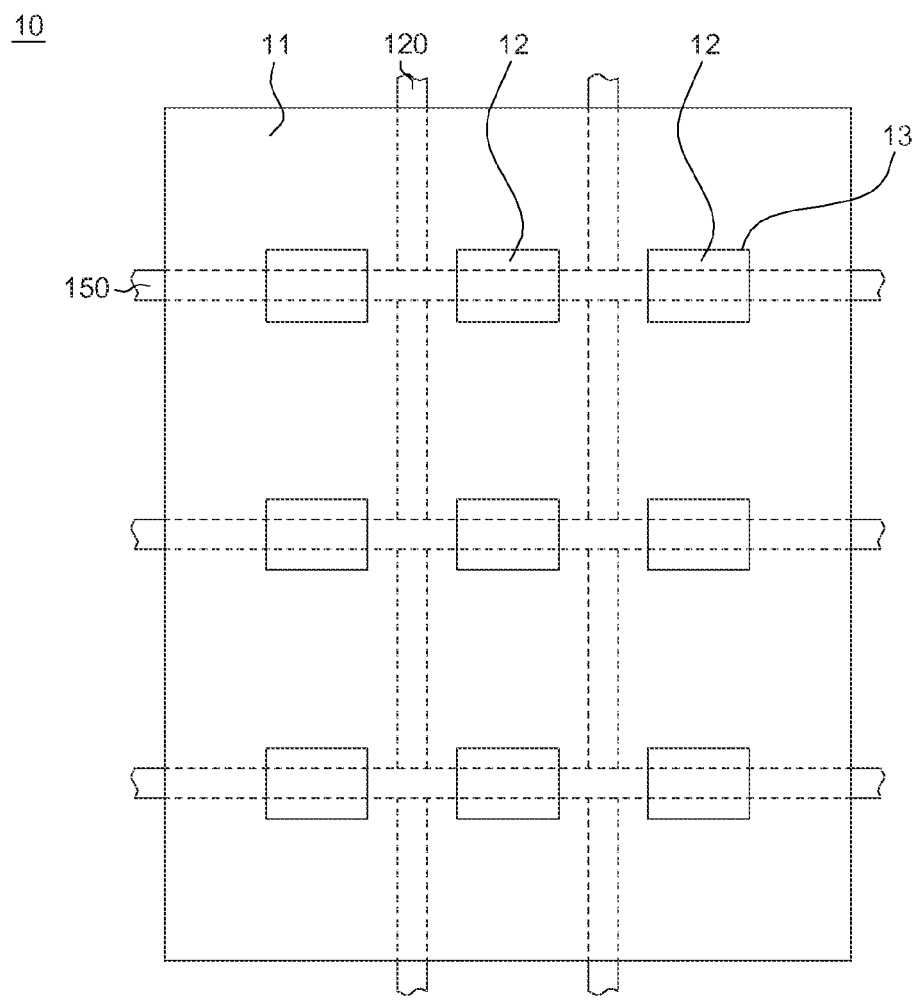
FIG. 1 is a top view of an array substrate 10 according to an embodiment of the invention.

Referring to FIG. 1, a top view of an array substrate 10 according to an embodiment of the invention is shown. The array substrate 10 is a part of an in-cell touching active-matrix organic light-emitting diode (AMOLED) display panel. The first touch electrode 120 and the second touch electrode 150 of a touch sensor are located inside the array substrate 10. The first touch electrode 120 and the second touch electrode 150 are for transferring and receiving a touch signal. The AMOLED display electrodes (exemplified by cathodes in the present embodiment) are formed above two touch electrodes. The array substrate 10 has a first area 11 and several second areas 12, wherein the second areas are not adjacent to each other. A boundary 13 between the first area and the second areas has a height difference.

Figure 2:
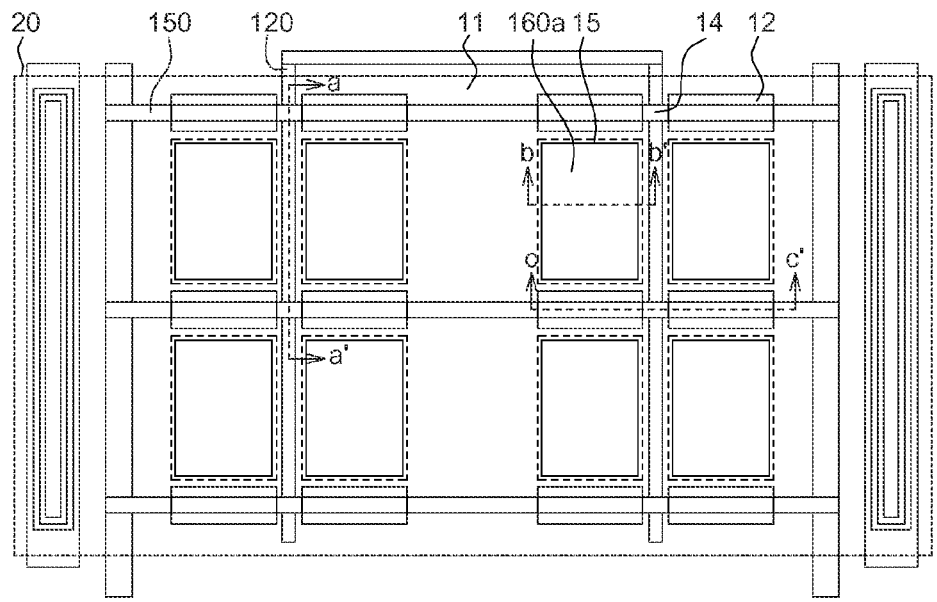
FIG. 2 is a schematic diagram of an array substrate 10 within a mask 20.

Due to the height difference of the array substrate, the display electrodes will break off into partitions in the boundary of different heights during the evaporation process, thereby dividing the display electrodes into a plurality of areas. In this process the display electrodes do not need to be patterned and have lower requirement in terms of precision. A layer of display electrodes can be formed by using an open mask. FIG. 2 is a schematic diagram of an array substrate 10 within an open mask 20. Here, the open mask 20 defines the entire active area of the display panel, and is exemplified by a first area 11 and twelve second areas 12. The second areas are not adjacent to each other, and each of the second areas 12 is smaller than the first area 11. In some embodiments, the array substrate can be divided into any number of first areas and any number of second areas, wherein the first areas and the second areas can be staggered with each other in the form of a grid, and the second areas can be adjacent to each other. The invention does not have specific restrictions regarding the arrangement of the first and second areas.

Figure 3A:
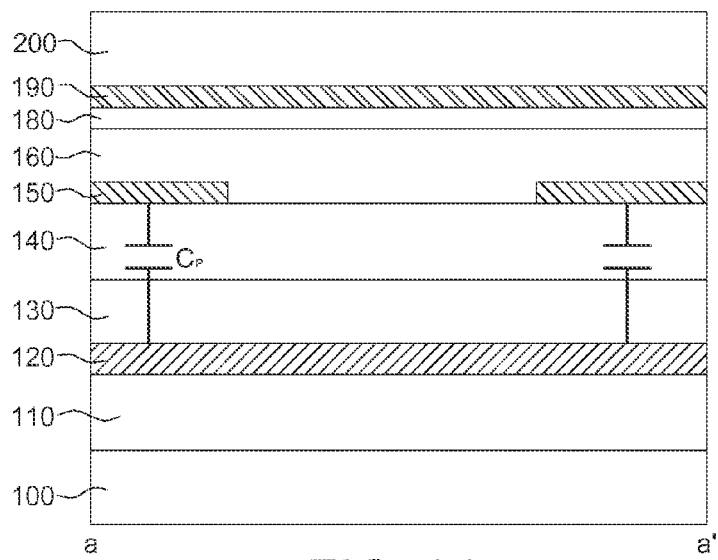
FIG. 3A is a cross-sectional view along a cross-sectional line a-a' of FIG. 2.
Figure 3B:
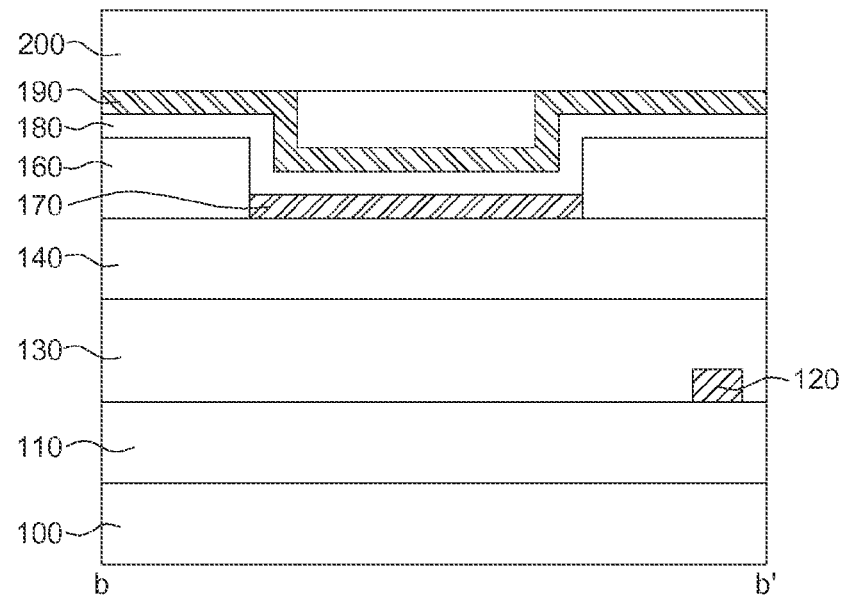
FIG. 3B is a cross-sectional view along a cross-sectional line b-b' of FIG. 2.
Figure 3C:
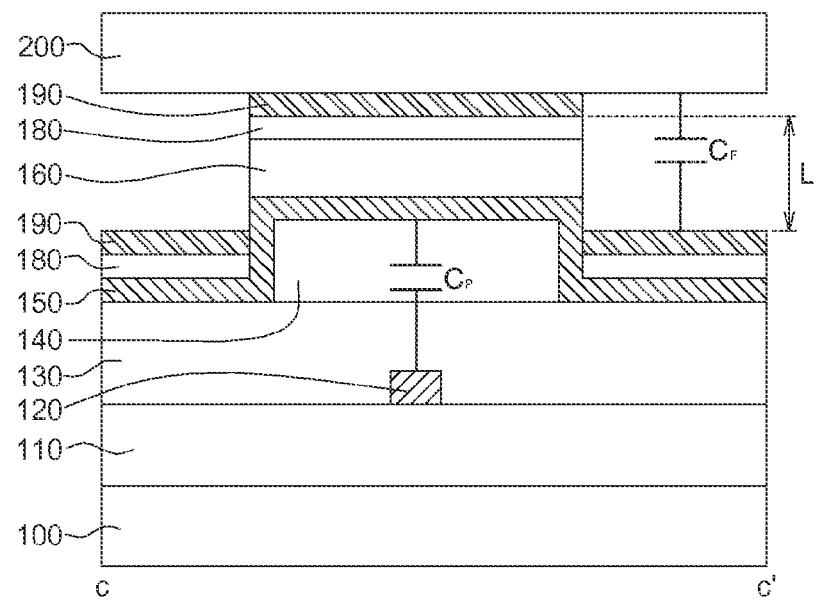
FIG. 3C is a cross-sectional view along a cross-sectional line c-c' of FIG. 2.

Details of the structure of the array substrate 10 are disclosed below with accompanying drawings FIG. 2 to FIG. 3C, FIG. 3A is a cross-sectional view along a cross-sectional line a-a' of FIG. 2; FIG. 3B is a cross-sectional view along a cross-sectional line b-b' of FIG. 2; FIG. 3C is a cross-sectional view along a cross-sectional line c-c' of FIG. 2.

Referring to FIG. 3A, a cross-sectional view a first touch electrode 120 of an array substrate 10 along a cross-sectional line a-a' is shown. A TFT element 110, a first touch electrode 120, an insulating layer 130, a planar layer 140, a second touch electrode 150, a pixel defining layer 160, an organic emitting layer 180 and a second electrode layer 190 are disposed on the first substrate 100 in a bottom up order. The TFT element 110 comprises a gate layer (not illustrated), a drain layer (not illustrated), a semiconductor layer (not illustrated) and a dielectric layer (not illustrated) for driving OLED pixels. The TFT element schematically illustrated in FIG. 3A can represent all structures disclosed above or only partial structures thereof. The first touch electrode 120 and the second touch electrode 150 are touch sensors. When the array substrate 10 is used as a display panel, a second substrate 200 can be further disposed above the second electrode layer 190 for purpose of protection.

As indicated in FIG. 3A, the array substrate 10 adopts in-cell touch, and has a touch sensor disposed therein. The touch sensor comprises a first touch electrode 120 and a second touch electrode 150 used as a driving electrode Tx and a sensing electrode Rx for transferring and receiving a touch signal respectively. The positions of the first and second touch electrodes are exchangeable, and the first and second touch electrodes can be composed of the same or different materials. The first touch electrode 120 and the second touch electrode 150 can be realized by two independent electrode layers, two parts of the same electrode layer or a part of the TFT element 110. For instance, the gate layer or drain layer of the TFT element 110 can be patterned during the deposition process, such that a part of the gate layer or the drain layer is used as touch electrode, while the other part of the gate layer or the drain layer remains its original function. Or, the first touch electrode 120 and the second touch electrode 150 can be formed with the OLED pixel electrode at the same time and become a part of the first electrode layer 170 of FIG. 3B. That is, the first touch electrode 120 can be composed of at least one of the gate layer, the drain layer, the first electrode layer and an additional electrode layer, while the second touch electrode 150 can be composed of at least one of the gate layer, the drain layer, the first electrode layer, the additional electrode layer and an extra electrode layer. The insulating layer 130 and the planar layer 140 both composed of a dielectric material are interposed between the first touch electrode 120 and the second touch electrode 150, such that a coupling capacitance $C_P$ can be generated between the first touch electrode 120 and the second touch electrode 150. When the user touches the display panel, a finger capacitance (not illustrated) will be generated and change the magnitude of the coupling capacitance $C_P$. The touch position can thus be obtained from analyzing the change in capacitance. However, as illustrated in FIG. 3A, the second electrode layer 190 disposed over the coupling capacitance $C_P$ is conductive and shields the finger capacitance, and the shielding effect of second electrode layer makes the coupling capacitance $C_P$ hard to change.

Referring to FIG. 3B, a cross-sectional view of an OLED pixel 15 on an array substrate 10 along a cross-sectional line b-b' is shown. A TFT element 110, a first touch electrode 120, an insulating layer 130, a planar layer 140, a first electrode layer 170, a pixel defining layer 160, an organic emitting layer 180 and a second electrode layer 190 are disposed above the first substrate 100 in a bottom up order. When the array substrate 10 is used as a display panel, a second substrate 200 can be further disposed above the second electrode layer 190 for purpose of protection, and a filter layer (not illustrated) can be disposed above the second electrode layer 190 such that the emitted light can have different colors.

As indicated in FIG. 3B and FIG. 2, the OLED pixel 15 is composed of the first electrode layer 170, the organic emitting layer 180 and the second electrode layer 190 which are disposed above the planar layer 140. The part of the pixel defining layer 160 inside the OLED pixel 15 is removed, wherein the removed area 160a forms a light emitting area. The size of the removed area 160a is smaller than or equal to the OLED pixel 15. The pixel defining layer 160 surrounds or partly covers the edge of the first electrode layer 170. In the present embodiment, the OLED is a top-emission architecture, the first electrode layer 170 is an anode, and the second electrode layer is a cathode. In some embodiments, the OLED can also be realized by a bottom-emission architecture; or, the position of cathode and the position of the anode are exchangeable, and the two architectures are not limited to the disclosed exemplifications.

Referring to FIG. 3C, a cross-sectional view of a second touch electrode 150 on an array substrate along a cross-sectional line c-c' is shown. A TFT element 110, a first touch electrode 120, an insulating layer 130, a planar layer 140, a second touch electrode 150, a pixel defining layer 160, an organic emitting layer 180 and a second electrode layer 190 are disposed above the first substrate 100 in a bottom up order.

As indicated in FIGS. 2 & 3C, a planar layer 140 and a pixel defining layer 160 are formed in the intersection 14 between the first touch electrode 120 and the second touch electrode 150. In the area with the second touch electrode 150 but without the first touch electrode 120, there is no planar layer 140 and pixel defining layer 160. A step L is formed between the areas with and without planar layer 140 and pixel defining layer 160. When an entire piece of the second electrode layer 190 is formed by way of vacuum evaporation with metal mask or deposition, the step L will break off the second electrode layer 190 into a first part and a second part. The first part (the intersection 14) of the second electrode layer 190 is conducted and electrically connects the cathode potential, while the second part (the area with the second touch electrode 150 but without the first touch electrode 120, ex: the second area 12 of FIG. 1) of the second electrode layer 190 can be electrically floating or electrically connected to the second touch electrode 150. A surface of first part is disposed above a surface of the second part. By doing so, the first part of the second electrode layer 190 is electrically insulated from the second part of the second electrode layer 190, and the shielding effect can be reduced. Therefore, the finger capacitance $C_F$ generated when the user touches the panel will be large enough to affect the magnitude of the coupling capacitance $C_P$ and generate a touch signal.

It should be noted that the step L of the present embodiment is composed of the planar layer 140 and the pixel defining layer 160, but is not limited thereto. In practical applications, the step L can be formed by patterning different dielectric materials (such as photoresist) according to the needs in the manufacturing process. In an embodiment, the thickness of the planar layer 140 is larger than or equal to 3 μm and the thickness of the pixel defining layer 160 is larger than or equal to 1 μm, such that the step L composed of the planar layer 140 and the pixel defining layer 160 has a height larger than or equal to 4 μm. However, the thickness of dielectric materials and the height of step can be adjusted according to the size of the substrate or the needs in the manufacturing process. Or, the step can be directly formed by planar layer through layout design and has a height larger than or equal to 3 μm. Moreover, some unfavorable influences may occur if the step L is too large. For instance, the planar layer 140 or the pixel defining layer 160 may be peeled off, the yield rate may decrease and the tact time may be prolonged. Therefore, the step L needs to be smaller than or equal to 10 μm and is preferably between 3 μm-10 μm.

In the present embodiment, the in-cell touch structure is disposed on the array substrate of the display panel. That is, the first touch electrode 120 and the second touch electrode 150 are disposed above one side of the organic emitting layer 180. In another embodiment, the first touch electrode 120 and the second touch electrode 150 are disposed above two opposite sides of the organic emitting layer 180. For instance, the first touch electrode 120 is interposed between the organic emitting layer 180 and the first substrate 100, while the second touch electrode 150 is interposed between the organic emitting layer 180 and the second substrate 200. In some embodiments, the first touch electrode 120 can be designed as an in-cell electrode, while the second touch electrode can be disposed outside the display panel.

According to the array substrate of the present embodiment, a step is formed above the substrate through the use of a patterned dielectric material, such that the second electrode layer breaks off into discontinuous areas to avoid shielding the touch sensor. The manufacturing process does not require the use of high precision fine mask nor require the use of negative photoresist. The materials of the array structure can be easily obtained, the cost and difficulties of the manufacturing process are reduced, and the compatibility of manufacturing process is increased.

While the invention has been described by way of example and in terms of the preferred embodiment (s), it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. An array substrate having at least a first area and at least a second area, wherein the array substrate comprises:
   a first substrate;
   a thin film transistor (TFT) element disposed above the first substrate, wherein the TFT comprises a gate layer, a drain layer and a semiconductor layer;
   an insulating layer disposed above the TFT element;
   a first electrode layer disposed above the insulating layer;
   an organic emitting layer disposed above the first electrode layer;
   a first touch electrode being one of a part of the gate layer, a part of the drain layer, a part of the first electrode layer and an additional electrode layer other than the gate layer, the drain layer and the first electrode layer, wherein the first touch electrode is for transferring or receiving a touch signal; and
   a second electrode layer disposed above the organic emitting layer, wherein the second electrode layer has a step in the boundary between the first area and the second area, wherein the second electrode layer comprises a cathode,
   wherein the second electrode layer comprising a first part and a second part, a surface of first part is disposed above a surface of the second part, and the first part is electrically insulated from the second part, wherein the second part of the second electrode layer located in the second area is electrically floating, and the first part of the second electrode layer is electrically connected to the cathode.

2. The array substrate according to claim 1, wherein the step is between 3 μm-10 μm.

3. The array substrate according to claim 1, further comprising:
   a planar layer disposed above the insulating layer; and
   a pixel definition layer disposed above the planar layer, wherein the step is formed by the planar layer and the pixel definition layer.

4. The array substrate according to claim 1, wherein the second electrode layer having the step is formed by way of vacuum evaporation with metal mask.

5. The array substrate according to claim 1, further comprising a second touch electrode being the other of the part of the gate layer, the part of the drain layer, the part of the first electrode layer and the additional electrode layer, or being an extra electrode layer other than the additional electrode, wherein the first touch electrode and the second touch electrode are used for receiving and transferring the touch signal respectively.

6. A display panel having at least a first area and at least a second area, wherein the display panel comprises:
   a first substrate;
   a second substrate disposed opposite to the first substrate;
   a thin film transistor (TFT) element disposed above the first substrate, wherein the TFT element comprises a gate layer, a drain layer and a semiconductor layer;
   an insulating layer disposed above the TFT element;
   a first electrode layer disposed above the insulating layer;
   an organic emitting layer disposed above the first electrode layer;
   a first touch electrode being one of a part of the gate layer, a part of the drain layer, a part of the first electrode layer and an additional electrode layer other than the gate layer, the drain layer and the first electrode layer, wherein the first electrode is for transferring or receiving a touch signal; and a second electrode layer disposed above the organic emitting layer, wherein the second electrode layer has a step in the boundary between the first area and the second area, wherein the second electrode layer comprises a cathode, wherein the second electrode layer comprising a first part and a second part, a surface of first part is disposed above a surface of the second part, and the first part is electrically insulated from the second part, wherein the second part of the second electrode layer located in the second area is electrically floating, and the first part of the second electrode layer is electrically connected to the cathode.

7. The display panel according to claim 6, further comprising:
   a planar layer disposed above the insulating layer; and
   a pixel defining layer disposed above the planar layer, wherein the step is formed by the planar layer and the pixel defining layer.

8. The display panel according to claim 6, wherein entire pieces of the second electrode layer with the step is formed by way of vacuum evaporation with metal mask.

9. The display panel according to claim 6, further comprising a second touch electrode being the other of the part of the gate layer, the part of the drain layer, the part of the first electrode layer, and the additional electrode layer, or being an extra electrode layer other than the additional electrode, wherein the first touch electrode and the second touch electrode are used for receiving and transferring the touch signal respectively.

* * * * *